United States Patent
Shah et al.

(10) Patent No.: US 10,298,222 B2
(45) Date of Patent: *May 21, 2019

(54) HIGH PERFORMANCE RADIO FREQUENCY SWITCH

(71) Applicant: Tagore Technology, Inc., Arlington Heights, IL (US)

(72) Inventors: Manish N. Shah, Vernon Hills, IL (US); Amitava Das, Barrington Hills, IL (US)

(73) Assignee: Tagore Technology, Inc., Arlington Heights, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/844,163

(22) Filed: Dec. 15, 2017

(65) Prior Publication Data

US 2018/0109250 A1    Apr. 19, 2018

Related U.S. Application Data

(63) Continuation-in-part of application No. PCT/US2016/037921, filed on Jun. 16, 2016.

(Continued)

(51) Int. Cl.
*H01L 29/06* (2006.01)
*H01L 29/20* (2006.01)
(Continued)

(52) U.S. Cl.
CPC ....... *H03K 17/063* (2013.01); *H01L 21/8252* (2013.01); *H01L 27/0207* (2013.01);
(Continued)

(58) Field of Classification Search
CPC ... H01L 29/788; H01L 29/205; H01L 29/778; H01L 23/535; H03K 17/16; H02M 3/07
See application file for complete search history.

(56) References Cited

U.S. PATENT DOCUMENTS 6,801,088 B2  10/2004  Allen et al.
8,624,261 B2   1/2014  Ikeda
(Continued)

FOREIGN PATENT DOCUMENTS

CN    101098135    1/2008
CN    102318048    1/2012
(Continued)

OTHER PUBLICATIONS

PCT Written Opinion of the International Searching Authority issued for International Application No. PCT/US2016/037921 dated Sep. 6, 2016.

(Continued)

*Primary Examiner* — Seahvosh Nikmanesh
(74) *Attorney, Agent, or Firm* — Fleit Gibbons Gutman Bongini Bianco PL

(57) ABSTRACT

A HEMT cell includes two or more gallium nitride ("GaN") high-electron-mobility transistor ("HEMT") devices electrically connected in series with each other. The HEMT cell includes a HEMT cell drain, a HEMT cell source and a HEMT cell gate. The HEMT cell drain connects with the drain of a first GaN HEMT device in the series. The HEMT cell source connects with the source of a last GaN HEMT device in the series. The HEMT cell gate connects to a first two-dimensional electron gas ("2DEG") gate bias resistor that connects with the gate of the first GaN HEMT device. The HEMT cell gate connects to a second 2DEG gate bias resistor that connects with the gate of the second GaN HEMT device. The first and second 2DEG gate bias resistors are located in a 2DEG layer of the HEMT cell. A multi-throw RF switch is also disclosed.

14 Claims, 13 Drawing Sheets

Related U.S. Application Data

(60) Provisional application No. 62/180,100, filed on Jun. 16, 2015, provisional application No. 62/180,117, filed on Jun. 16, 2015.

(51) Int. Cl.

| | | |
|---|---|---|
| *H03K 17/06* | (2006.01) | |
| *H01L 27/02* | (2006.01) | |
| *H01L 29/423* | (2006.01) | |
| *H01L 29/778* | (2006.01) | |
| *H01L 27/06* | (2006.01) | |
| *H01L 49/02* | (2006.01) | |
| *H01L 29/08* | (2006.01) | |
| *H01L 29/205* | (2006.01) | |
| *H01L 21/8252* | (2006.01) | |
| *H01L 29/417* | (2006.01) | |
| *H01L 29/78* | (2006.01) | |
| *H03K 17/687* | (2006.01) | |
| *H01L 21/8258* | (2006.01) | |

(52) U.S. Cl.
CPC ...... *H01L 27/0605* (2013.01); *H01L 27/0629* (2013.01); *H01L 28/20* (2013.01); *H01L 29/0649* (2013.01); *H01L 29/0696* (2013.01); *H01L 29/0847* (2013.01); *H01L 29/2003* (2013.01); *H01L 29/205* (2013.01); *H01L 29/4238* (2013.01); *H01L 29/7786* (2013.01); *H01L 29/7787* (2013.01); *H01L 21/8258* (2013.01); *H01L 29/41758* (2013.01); *H01L 29/7831* (2013.01); *H03K 2017/066* (2013.01); *H03K 2017/6875* (2013.01); *H03K 2217/0081* (2013.01)

(56) References Cited

U.S. PATENT DOCUMENTS

| 9,548,731 | B2* | 1/2017 | Shah ............... H01L 27/0207 |
|---|---|---|---|
| 2008/0317154 | A1 | 12/2008 | Nakajima et al. |
| 2011/0025404 | A1 | 2/2011 | Cassia |
| 2011/0193191 | A1 | 8/2011 | Bito |
| 2012/0267719 | A1 | 10/2012 | Brindle et al. |
| 2013/0009725 | A1 | 1/2013 | Heaney et al. |
| 2014/0292395 | A1 | 2/2014 | Wu et al. |
| 2014/0084347 | A1 | 3/2014 | Salcedo et al. |
| 2014/0091311 | A1 | 4/2014 | Jeon et al. |
| 2014/0098585 | A1 | 4/2014 | Ikeda |
| 2014/0374766 | A1 | 12/2014 | Bahl et al. |

FOREIGN PATENT DOCUMENTS

| CN | 103595380 | 2/2014 |
|---|---|---|
| JP | 2007006180 | 11/2007 |

OTHER PUBLICATIONS

PCT International Search Report issued for International Application No. PCT/US2016/037921 dated Sep. 6, 2016.

National Intellectual Property Administration, PRC Search Report for Patent Application No. 2016800482548 dated Sep. 23, 2018.

National Intellectual Property Administration, PRC First Office Action for Patent Application No. 2016800482548 dated Oct. 8, 2018.

European Search Report for European Patent Application No. EP 16812463.4 dated Dec. 24, 2018.

* cited by examiner

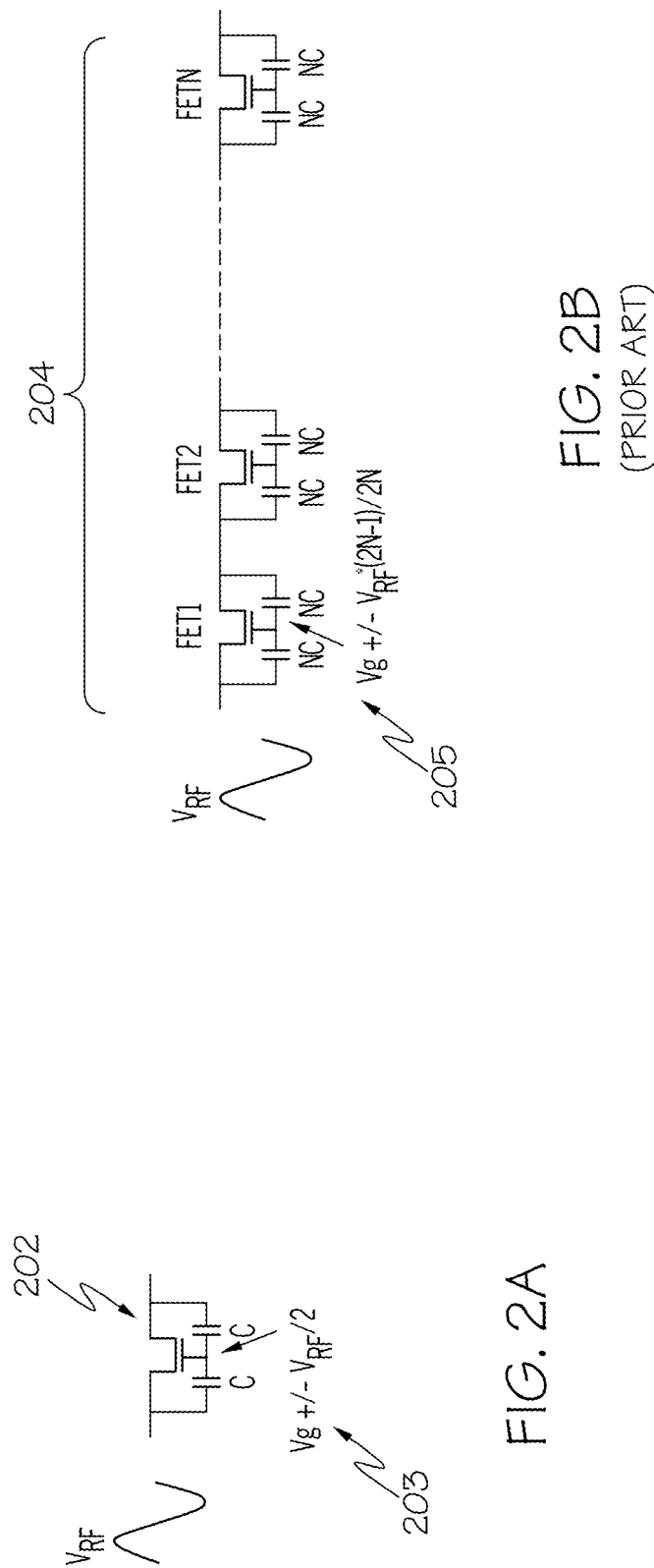

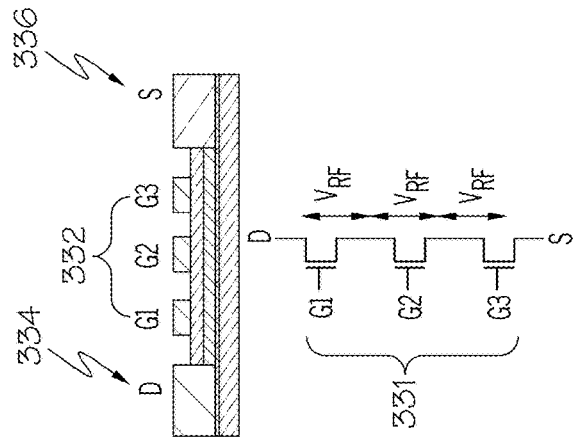
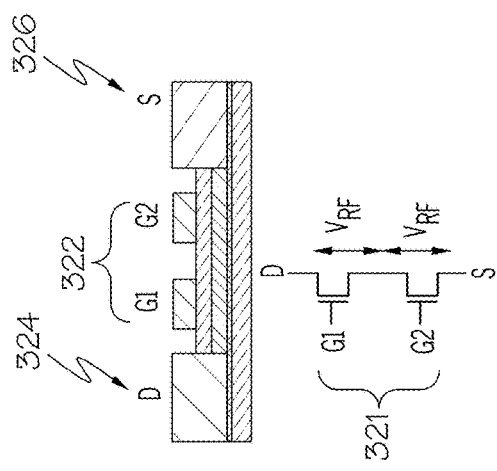
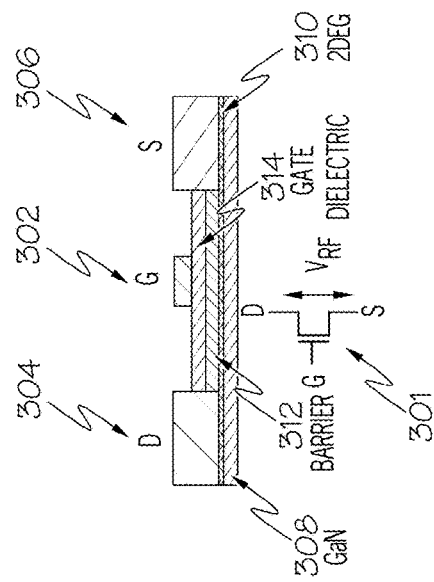
FIG. 3A
FIG. 3B
FIG. 3C

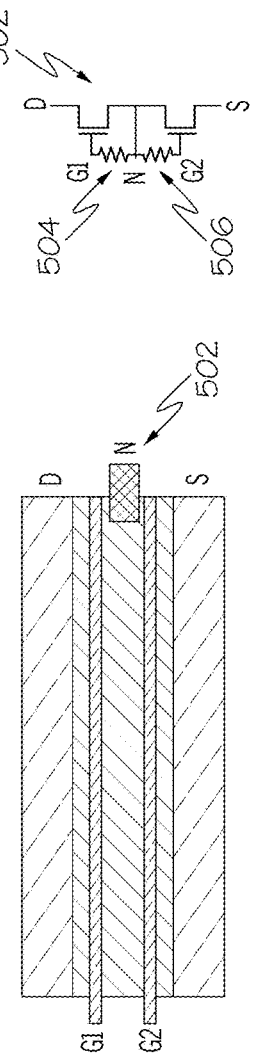
FIG. 5C
FIG. 5B
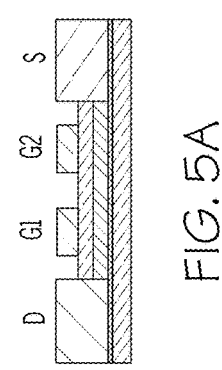
FIG. 5A
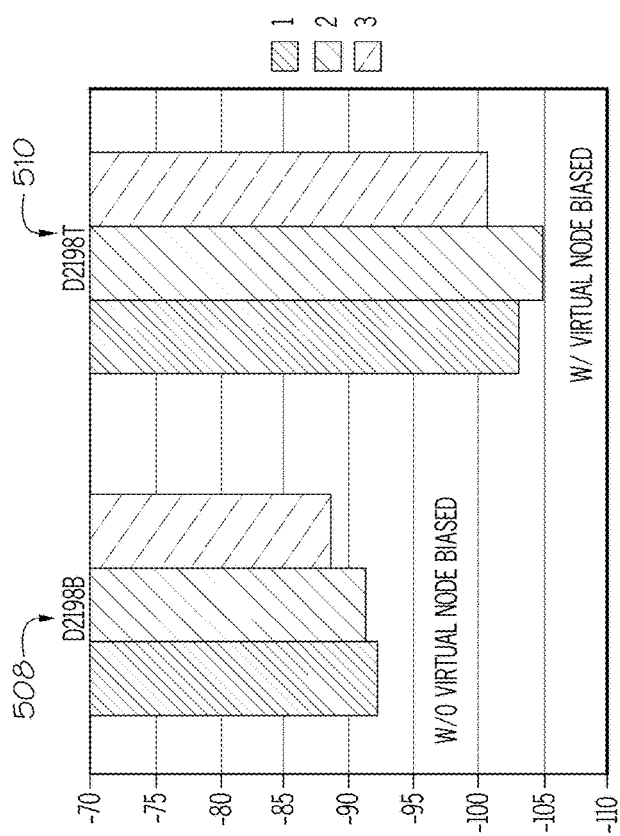
FIG. 5D

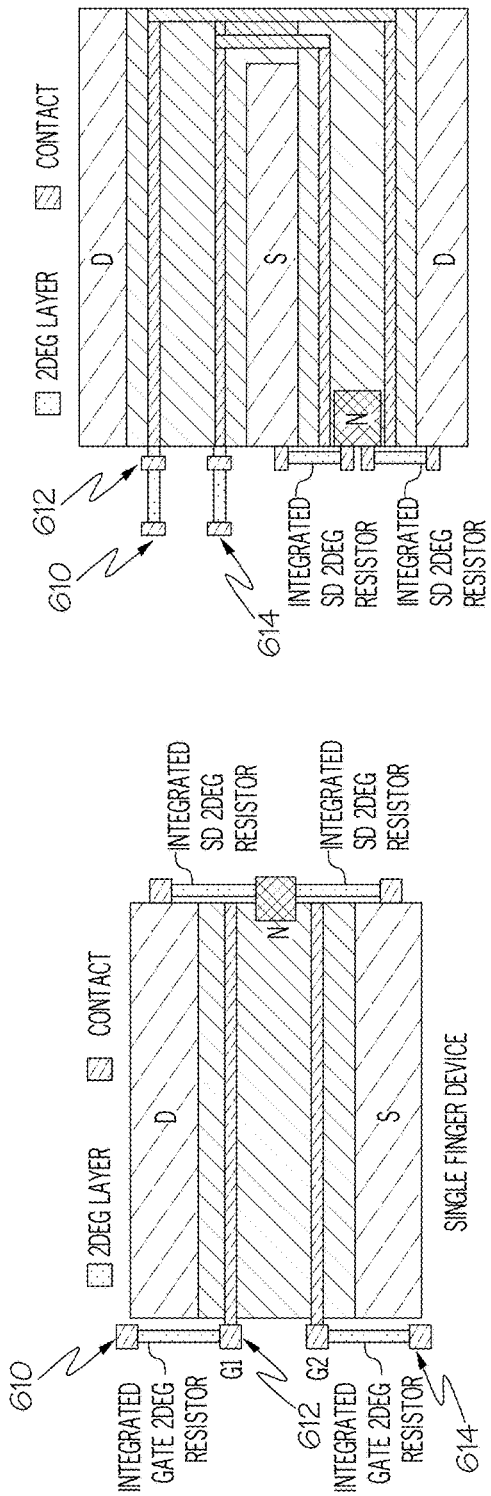
FIG. 6A
FIG. 6B
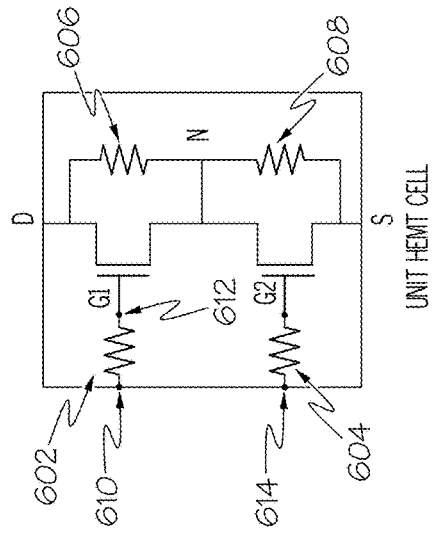
FIG. 6C

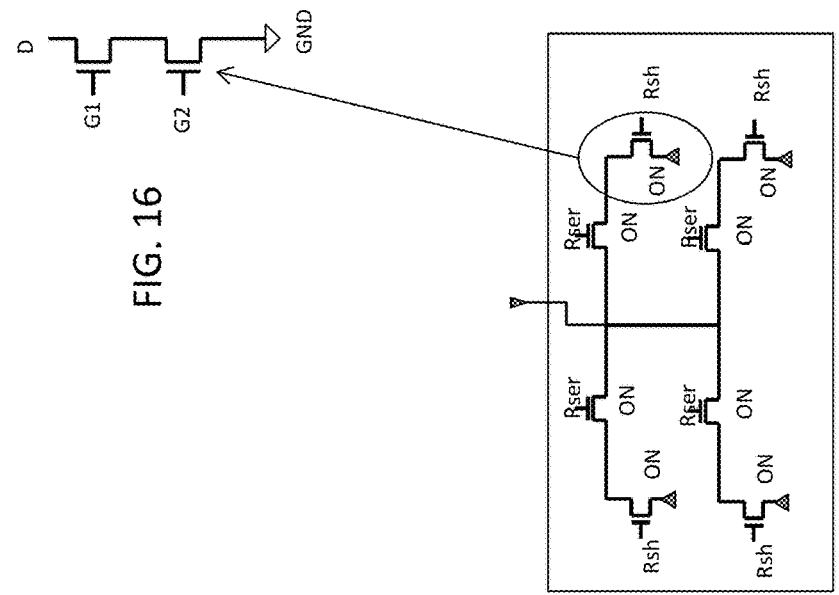
FIG. 15
FIG. 16
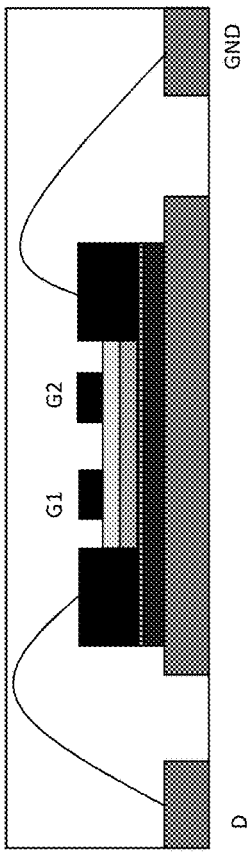
FIG. 13
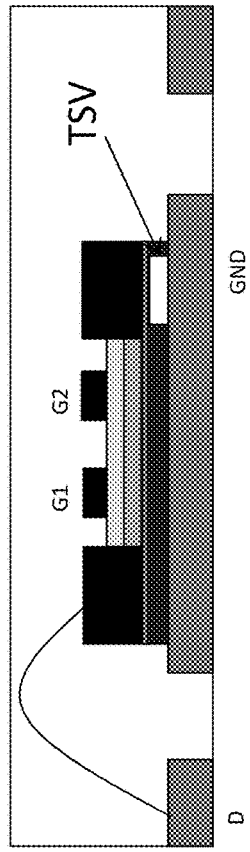
FIG. 14

HIGH PERFORMANCE RADIO FREQUENCY SWITCH

CROSS-REFERENCE TO RELATED APPLICATIONS

This application is a continuation-in-part of international patent application No. PCT/US2016/037921 which is based upon and claims priority from prior U.S. Provisional Patent Application No. 62/180,100, filed on Jun. 16, 2015, and from prior U.S. Provisional Patent Application No. 62/180,117, filed on Jun. 16, 2015, the disclosures of which are herein incorporated by reference in their entirety.

BACKGROUND

The present disclosure generally relates to active solid-state devices, and more specifically to gallium nitride, high-electron-mobility transistors used as switches.

A gallium nitride (hereinafter "GaN") high-electron-mobility transistor (hereinafter "HEMT") is a depletion mode device (normally ON) that may be used as a switch. To turn the switch OFF, a gate needs to be biased at a negative voltage. Most applications do not have a negative voltage available on an application platform, thus the negative voltage needs to be generated from a smaller positive supply voltage. Generation of a negative voltage requires many stages of charge pump circuits. Each stage of a charge pump requires a capacitor. A size of the capacitor is dependent on a load current that the charge pump circuit has to source. The load current is a gate current of the HEMT device that the charge pump circuit is driving.

Modern applications demand that an RF switch handle high speed switching of high power RF signals, with high broadband isolation and low noise when the switch is OFF, and with low broadband insertion loss when the switch is ON. Every switch can have parasitic inductance, capacitance, conductance, and resistance. These parasitic components combine to attenuate and degrade the signal that the switch is being use to route. The power loss and voltage attenuation caused by these components varies with frequency of the input signal and can be affected by the insertion loss of the switch at that frequency. It is important that the insertion loss of a switch is acceptable at the bandwidth requirement of the application.

Many RF switches, such as PIN diode switches, suffer from high current drain. This can result in undesirable wasted power and generation of heat in certain applications.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 2A is a schematic of a radio frequency (RF) switch in accordance with the disclosure.

FIG. 2B is a schematic of a prior art RF switch.

FIG. 3A is a cross-sectional view of a GaN HEMT structure with one gate, in accordance with one embodiment of the disclosure.

FIG. 3B is a cross-sectional view of a GaN HEMT structure with dual gates, in accordance with one embodiment of the disclosure.

FIG. 3C is a cross-sectional view of a GaN HEMT structure with triple gates, in accordance with one embodiment of the disclosure.

FIG. 5A is a cross-sectional view of the GaN HEMT structure with dual gates, in accordance with one embodiment of the disclosure.

FIG. 5B is a top view of the GaN HEMT structure shown in FIG. 5A.

FIG. 5C is a schematic of the GaN HEMT structure shown in FIGS. 5A and 5B.

FIG. 5D is a graph showing harmonic distortion performance of the GaN HEMT structure shown in FIGS. 5A and 5B.

FIG. 6A is a top view of a single-finger GaN HEMT structure with dual gates including high density bias resistors realized using a 2DEG layer, in accordance with one embodiment of the disclosure.

FIG. 6B is a top view of a multi-finger GaN HEMT structure with dual gates.

FIG. 6C is a schematic of a Unit HEMT cell, in accordance with the disclosure.

FIG. 13 is a cross-sectional view of a GaN HEMT structure with dual gates, in accordance with one embodiment of the disclosure.

FIG. 14 is a cross-sectional view of a GaN HEMT structure with dual gates with a through silicon via, in accordance with another embodiment of the disclosure.

FIG. 15 is a simplified schematic of a switch in accordance with one embodiment of the disclosure.

FIG. 16 is a schematic of a GaN HEMT with two gates as can be used in the switch of FIG. 15.

DETAILED DESCRIPTION

Figure 1:
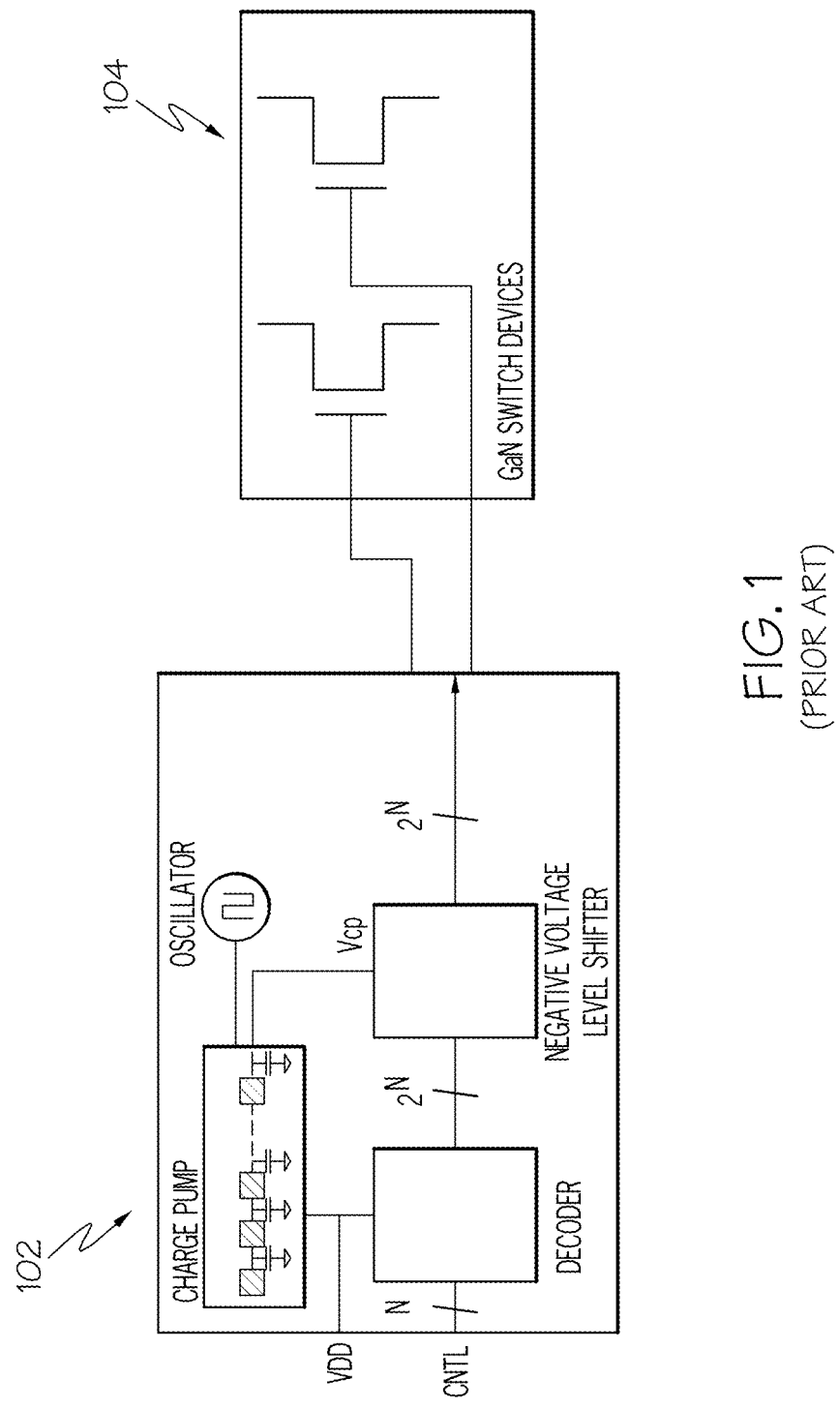
FIG. 1 is a simplified block diagram of a CMOS controller including an n-stage charge pump, and GaN switch devices.

It is to be understood that the present disclosure will be described in terms of given illustrative examples. However, other semiconductor architectures, structures, substrate materials, and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The terms "RF", "radio frequency", or the like, as used herein generally refer to a broad spectrum of signal frequencies. The spectrum of frequencies may include, but is not limited to, frequencies in any one or more of very low frequency range, very high frequency range, ultra-high frequency range, microwave frequency range, millimeter wave frequency range, or higher frequency range, unless the context of the particular use herein is clearly specified otherwise.

Various embodiments may include a design for an integrated circuit chip, which may be created in a graphical computer programming language, and stored in a computer storage medium (such as a disk, tape, physical hard drive, or virtual hard drive such as in a storage access network). If a designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can be then integrated with other chips, discrete circuit elements, and/or other signal processing devices as part of either (a) an intermediate product, such as a motherboard, or (b) an end product. The end product can be any product that includes integrated circuit chips, such as for example, and not for limitation, mobile wireless communication devices, cellular infrastructure, military communications radio, software defined radios, AESA radar, digital communication links, avionics, LTE relays, small cells, TDD microcells, RF base stations, PMR/LMR high power radios, antenna tuning switches, 3G/4G multimode multiband switching systems, Rx diversity band switching systems, high linearity general purpose applications, satellite terminals, satellite transceivers, RF and microwave test equipment, and many other commercial applications and military applications.

According to various embodiments, disclosed is a high power and high voltage radio frequency (RF) switch using GaN technology. The switch incorporates many circuit techniques for superior performance and size. A switch in accordance with the disclosure is realized with an insulated gate that enables using much lower current and smaller size bias circuit that can be integrated in a same package without external passive components.

Referring now to the drawings in which like numerals represent the same of similar elements, FIG. 1 shows an example of a prior art CMOS controller 102 including an n-stage charge pump and driver circuit. A plurality of discrete GaN switch devices 104 may be switched ON or OFF with the drive output signals from the CMOS controller 102.

FIG. 2A is a schematic of an RF switch in accordance with the disclosure. The switch in accordance with the disclosure uses an HEMT structure with an insulated gate which reduces the gate current. Lower gate current reduces the size of the capacitor, or capacitors, used in the n-stage charge pump and driver circuit to drive the HEMT structure; thus, the capacitor can be integrated on a die of a complementary metal-oxide-semiconductor (hereinafter "CMOS") controller. Additionally, the lower gate current reduces the current drain of a signal used to control the switch HEMT structure. In certain applications, a discrete capacitor can be avoided altogether. The switch device 202, shown in FIG. 2A, can be driven at its gate input according to the formula 203, as shown.

FIG. 2B is a schematic of a prior art RF switch that uses a stack of Schottky HEMT/SOI FET structures. Most known GaN switches use a Schottky HEMT/SOI FET structure. A Schottky HEMT has almost 1000× higher gate leakage than an insulated gate. Higher leakage current HEMT requires a high current charge pump which in turn disadvantageously requires external capacitors. The Schottky HEMT/SOI FET structure utilizes a stack 204 of discrete switch devices, as shown in FIG. 2B. The stack 204 includes a plurality of discrete interconnected switch devices where each gate input can be driven according to the formula 205, as shown. Additionally, break down voltage of FET/HEMT structure requires using the stack 204 of a plurality of discrete switch devices which increase insertion loss of switch. Insertion loss is an important figure of merit for switch devices.

A switch in accordance with the present disclosure does not require any external capacitor. The new and novel HEMT structure switch in accordance with the disclosure can be realized without stacking multiple discrete switch devices, as will be discussed in more detail below. This significantly lowers insertion loss for the new and novel switch. Instead, the gate of the switch is biased at a much higher level of negative voltage to turn OFF the switch. However, the insulated gate of the new HEMT structure switch significantly reduces the gate current to drive the switch to turn it OFF. These and other advantages of the new and novel HEMT structure switch will be discussed below.

Most known switches realize higher power by stacking multiple discrete HEMTs/FETs in series because each device cannot handle large voltage. Stacking multiple HEMTs increases the size of each HEMT. This is due to the very large size of the switch devices that would be required to reduce overall insertion loss for the switch. For example, if there is a stack of N HEMTs, each HEMT would be N times bigger than a single HEMT to get a same ON resistance. This increases the size of the switch significantly.

Not stacking multiple devices has an advantage in terms of size but requires larger negative bias voltage to prevent a switch from turning ON during positive or negative peak of RF voltage. The gate voltage of the switch in accordance with the disclosure is biased at much higher negative voltage to keep the HEMT devices OFF. The switch in accordance with the disclosure, which has an insulated gate with lower leakage current than known switches, allows use of a low-current negative-bias generator without any external capacitor.

FIG. 3A is a cross-sectional view of a GaN HEMT structure with one gate in accordance with one embodiment of the disclosure. FIG. 3A illustrates a single gate switch device 301 fabricated on a GaN layer 308 and having a gate 302, a drain 304, and a source 306, as shown. A 2DEG layer 310 supports an insulative barrier layer 312 and disposed on top of the barrier layer 312 is a gate dielectric layer 314 as shown. The gate 302 is formed on the gate dielectric layer 314. The drain 304 and source 306 are adjacent to the gate respectively on either side of the gate, as shown. The drain 304 and source 306 contacts are formed by first etching off the dielectric layer. Once the dielectric is etched off, an ohmic contact is formed by depositing contact metal using semiconductor process. The contact could be made by etching off barrier layer or depositing metal through barrier layer. The gate dielectric layer 314 extends from the drain 304 to the source 306. The gate dielectric layer 314 is disposed on an insulative barrier layer 312. The barrier layer 312 is disposed on a two-dimensional electron gas (2DEG) layer 310. The 2DEG layer 310 is disposed on a gallium nitride (hereinafter "GaN") layer. In certain embodiments, the GaN layer 308 is disposed on a circuit supporting substrate layer that can comprise any of various materials, e.g., silicon or silicon carbide. See also FIG. 7, and the associated discussion below.

In another embodiment of a GaN HEMT structure (not shown), the drain 304 and the source 306 are deposited on the barrier layer 312. In other words, in such other embodiment, the barrier layer 312 is not removed from the area between the drain 304 and the 2DEG layer 310, and the barrier layer 312 is not removed from the area between the source 306 and the 2DEG layer 310. In such other embodiment, the barrier layer 312 becomes conductive at the drain 304 and the source 306.

Device stress can be relieved by using a multigate GaN HEMT structure. In one embodiment, the HEMT structure in accordance with the disclosure uses a multigate structure to improve technology figure of merit (e.g., low insertion loss while the switch is ON, high isolation while the switch is OFF, and fast switching time between ON and OFF), smaller size and higher voltage handling. A dual-gate HEMT structure is generally similar to having two HEMT devices in series without having common source and drain terminal parasitic. As shown in FIG. 3B, the dual-gate HEMT structure can handle two times the voltage that a single-gate HEMT structure can handle. FIG. 3B is a schematic of a two gate device 321. The device structure includes two gates 322 disposed on the same gate dielectric layer 314, a dual-gate HEMT structure drain 324, and a dual-gate HEMT structure source 326, as shown. The gate dielectric layer 314 extends between the drain 334 and the source 336.

Similar to FIG. 3A, in FIG. 3B the gate dielectric layer 314 is disposed on an insulative barrier layer 312. The barrier layer 312 is disposed on a two-dimensional electron gas (2DEG) layer 310. The 2DEG layer 310 is disposed on a gallium nitride (hereinafter "GaN") layer 308. In certain embodiments, the GaN layer 308 is disposed on a circuit supporting substrate layer that can comprise any of various materials, e.g., silicon or silicon carbide.

As shown in FIG. 3C, a triple-gate HEMT structure can handle three times the voltage that the single-gate HEMT structure can handle. FIG. 3C is a schematic of a three gate device 331. The device structure includes three gates 332 disposed on the same gate dielectric layer 314, a triple-gate HEMT structure drain 334, and a triple-gate HEMT structure source 336, as shown. The gate dielectric layer 314 extends between the drain 334 and the source 336.

Similar to FIG. 3A, in FIG. 3C the gate dielectric layer 314 is disposed on an insulative barrier layer 312. The barrier layer 312 is disposed on a two-dimensional electron gas (2DEG) layer 310. The 2DEG layer 310 is disposed on a gallium nitride (hereinafter "GaN") layer 308. In certain embodiments, the GaN layer 308 is disposed on a circuit supporting substrate layer that can comprise any of various materials, e.g., silicon or silicon carbide.

Figure 3D:
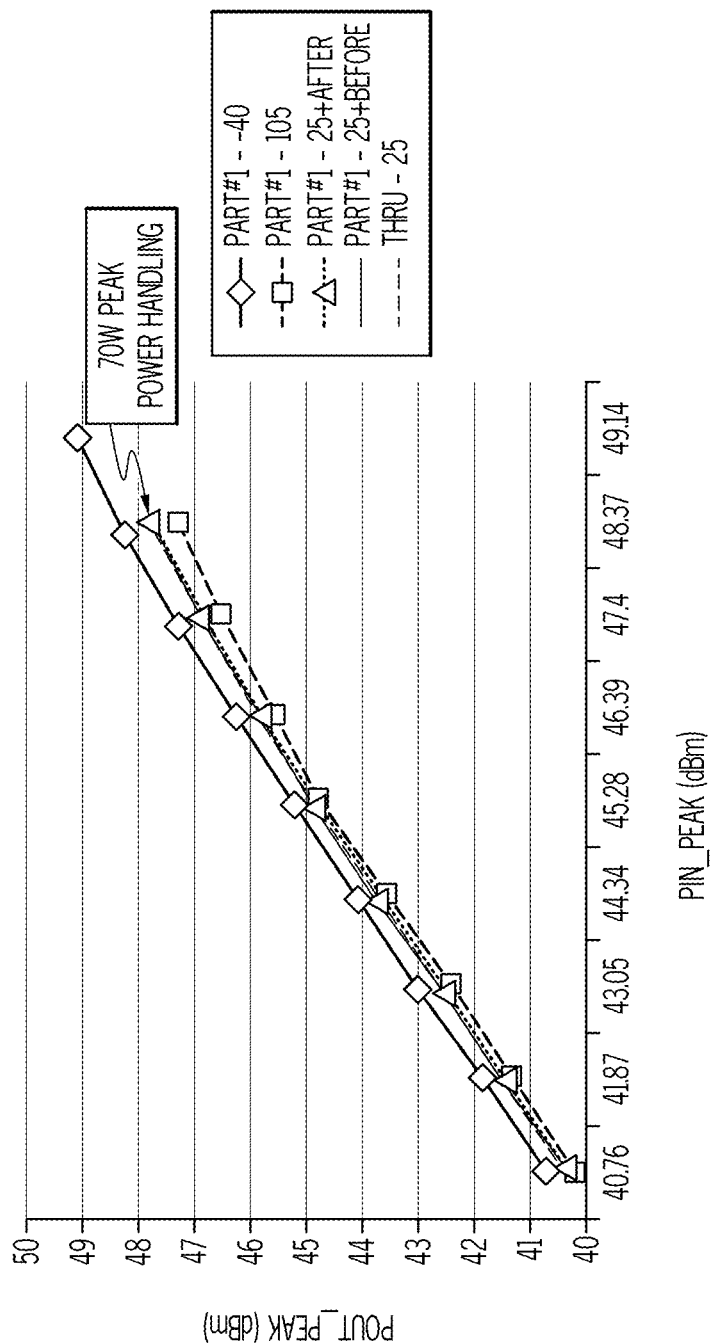
FIG. 3D is a graph of power out peak (dBm) versus power in peak (dBm) for a sample of a switch, in accordance with the disclosure.

As shown in FIG. 3D, an example of a SP2T switch designed with two dual-gate HEMT devices can handle, for example, up to 70 W of peak power when each gate is biased at −15V.

Figure 4:
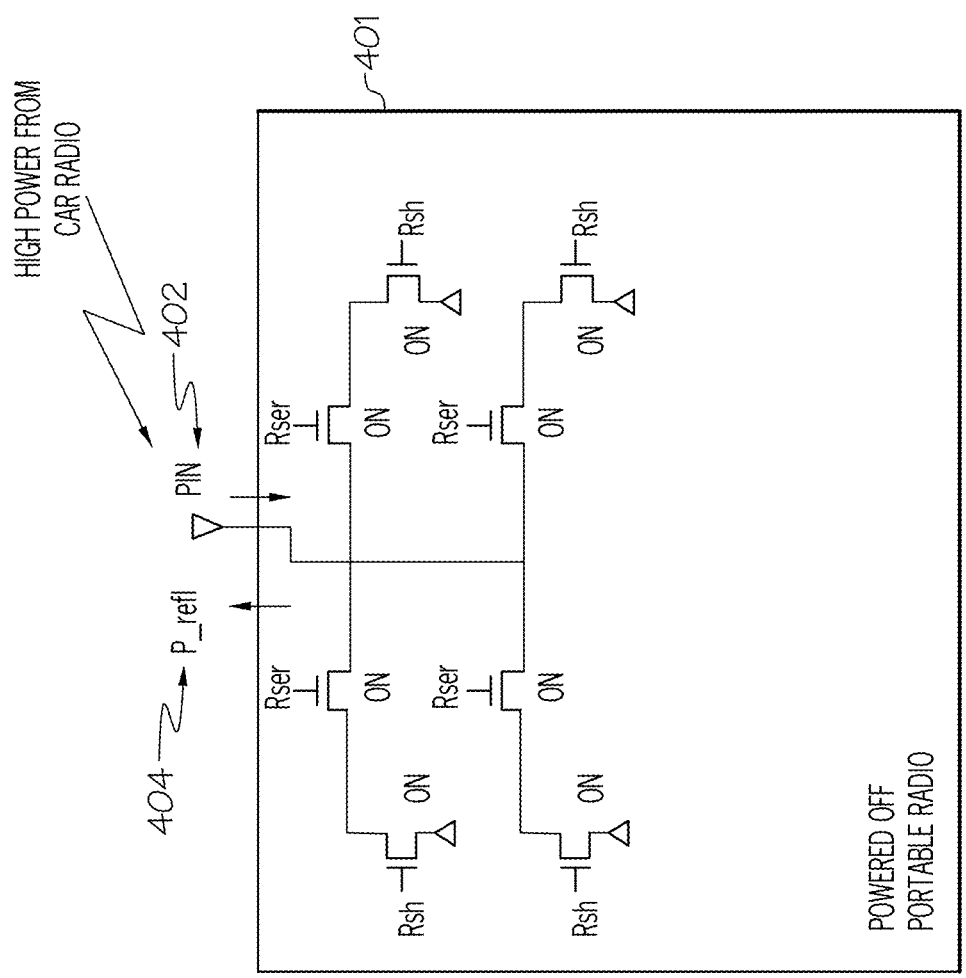
FIG. 4 is a schematic of a circuit that includes switches, in accordance with the disclosure.

FIG. 4 is a schematic of a circuit, for example in a portable radio 401 that includes switches in accordance with the disclosure. With the switch in accordance with the disclosure, all GaN HEMT devices are depletion mode devices and remain ON when the switch is unbiased which provides a low impedance and a significant mismatch of impedance to an antenna circuit at a common node. As a result of this mismatch, at the common node the reflected power 404 is substantially all incident power input 402. This lowers power dissipation in the RF switch and prevents the RF switch from being damaged.

Professional mobile radio switches and military radio switches have a requirement of handling large power when switch supply is OFF. This requirement comes from the fact that a handheld radio could be in a vehicle in which a higher power vehicular radio is installed. In this scenario, the handheld radio could be exposed to large RF power when the vehicular radio is transmitting in spite of the switch supply of the handheld radio being OFF.

The GaN HEMT devices of the switch in accordance with the disclosure are sized such that total impedance seen at the common node is low. Equivalent impedance of the switch at an antenna node is $(R_{ser}+R_{sh})/N$. Where N is number of throws in the switch. With the switch in accordance with the disclosure, the GaN HEMT devices are depletion mode devices that are kept ON when there is no supply voltage present. Series and shunt HEMTs are sized such that the low impedance reflects most of the incident power. This lowers power dissipation in the switch in accordance with the disclosure and prevents the switch from being damaged.

TABLE 1

| Pin(dBm) | P_refl(dBm) |
|---|---|
| 27.05 | 26.98 |
| 29.03 | 28.99 |
| 31.04 | 30.9 |
| 33.02 | 32.92 |

TABLE 1-continued

| Pin(dBm) | P_refl(dBm) |
|---|---|
| 35.02 | 34.87 |
| 36.98 | 36.82 |

Table 1 shows incident power and reflected power when a single-pole, four-throw (SP4T) switch is unbiased. The data in Table 1 shows that almost all power is advantageously reflected back. The switch in accordance with the disclosure can handle 10 W of power even when supply voltage is not present.

FIG. 5A is a cross-sectional view of the GaN HEMT structure with dual gates in accordance with one embodiment of the disclosure. This type of structure, generally with a plurality of gates, may also be referred to herein as a Unit HEMT cell. FIG. 5B is a top view of the GaN HEMT structure shown in FIG. 5A. FIG. 5C is a schematic of the GaN HEMT structure shown in FIGS. 5A and 5B.

A multigate GaN HEMT structure has electrical access to virtual node 502 between two gates to bias virtual node 502 for improved linearity performance A multigate HEMT device without a biased virtual node would have virtual node float at different voltages. Floating voltage is dependent on parasitic leakage current mismatch between top device and bottom device. The parasitic leakage current is through parasitic resistors 504, 506. In another embodiment (not shown), virtual node 502 is absent. As illustrated in FIG. 5C, parasitic resistors 504, 506 couple signal between the gate inputs and the virtual node 502 affecting the overall bias of the GaN switch devices. This mismatch can create asymmetric voltage division and can degrade linearity performance of the HEMT device. The virtual node 502 is accessed by using a contact at one end of finger between the two gates. This contact is formed, according to the example, using the same semiconductor process steps as used to create source and drain contact. For a serpentine HEMT layout, similar to shown in FIG. 6B, virtual node for all fingers are electrically connected through an undepleted 2DEG layer. Because virtual nodes of all fingers are electrically connected, a virtual node contact is needed only for one of the finger for multi-finger HEMT device. Having access to the virtual node electrical allows for biasing of the virtual node to a desired potential using linearity resistors 606 and 608. FIG. 6B shows HEMT layout of a dual gate structure with virtual node biased for a two-finger device. A same structure could be used with a HEMT device having more than two gates. For example, a triple gate HEMT device similar to that shown in FIG. 3C would have two virtual nodes and thus would include two virtual node contacts.

FIG. 5D is a graph showing harmonic distortion performance of the GaN HEMT structure shown in FIGS. 5A and 5B. With the virtual node 502 unbiased a first bar chart 508 shows performance of the GaN HEMT device without the virtual node being biased. Bar chart 510 illustrates performance of the GaN HEMT device with the virtual node 502 being biased. FIG. 5D shows a 10-15 dB improvement in 3rd order harmonic performance when the virtual node is biased. It should be noted that while various embodiments may use linearity biasing resistors (e.g., such as linearity resistors 606 and 608 shown in FIG. 6C), use of linearity biasing resistors is not required in other embodiments of the present disclosure.

FIG. 6A is a top view of an example of a single-finger GaN HEMT cell structure with dual gates including high density bias resistors realized using a two-dimensional electron gas (hereinafter "2DEG") layer, in accordance with one embodiment of the disclosure. FIG. 6B is a top view of a multi-finger dual gate GaN HEMT structure with serpentine form. FIG. 6B shows an alternative GaN HEMT structure fabrication corresponding to the single-finger GaN HEMT cell structure shown in FIG. 6A. With the switch in accordance with the disclosure, a high density bias resistor is realized using a 2DEG layer which enables a compact layout and Unit HEMT cell for switch design with lower parasitic voltages and with better performance in the figure of merit parameters for the switch. The switch in accordance with the disclosure is fabricated with a more cost effective process because it does not require additional mask/layer to construct resistor. It should be noted that various embodiments may use one or more 2DEG resistors connected in different ways. For example, multiple resistors can be fabricated in series-series, series-parallel, etc. Various implementations of the 2DEG resistor are possible.

FIG. 6C is a schematic of a Unit HEMT cell, in accordance with the disclosure. The schematic of FIG. 6C corresponds to the GaN HEMT structures shown in FIGS. 6A and 6B.

As shown in FIG. 6C, each HEMT cell gate input 610, 614, is connected to one contact of a respective gate bias resistor 602, 604. The other contact of the respective gate bias resistor 602, 604 is connected to a respective gate G1, G2, of a GaN switch device in the Unit HEMT cell. It should be noted that each of the gate bias resistors 602, 604, are not necessarily a single resistor device, and can be realized using various combinations of resistor devices in series-series, series-parallel, etc. The gate inputs 610, 614, can be electrically connected together and driven by a common signal which thereby drives a gate bias voltage into the respective gates G1, G2 of the respective GaN HEMT switch devices in the Unit HEMT cell.

Two series drain-to-source linearity bias resistors 606, 608, provide bias to the virtual node N. A first drain-to-source linearity bias resistor 606 is electrically connected between the drain and source of the first GaN HEMT device. A second drain-to-source linearity bias resistor 608 is electrically connected between the drain and source of the second GaN HEMT device. It should be noted that each of the linearity bias resistors 606, 608, are not necessarily a single resistor device, and can be realized using various combinations of resistor devices in series-series, series-parallel, etc. The first and second GaN HEMT devices are electrically connected in series with each other such that the first GaN HEMT device is electrically connected in series with the second GaN HEMT device by sharing one of the drain or source of the first GaN HEMT device with one of the drain or source of the second GaN HEMT device, as shown schematically in FIG. 6C which corresponds to the structures shown in FIGS. 6A and 6B. The virtual node N which is undepleted 2DEG (when GaN HEMT device is in OFF condition) is biased through same contact as used in forming source and drain. This contact can be placed only at an edge of one finger for a multi-finger device, as shown in FIG. 6B, to create a complete Unit HEMT cell for an RF switch. According to one example implementation, a Unit HEMT cell incorporates a gate bias resistor, a drain to virtual node linearity resistor, and source to virtual node linearity resistor, without requiring additional process steps or masks. This Unit HEMT cell, which is a fundamental building block for any RF switch design, is illustrated in FIGS. 6A and 6B for a single-finger Unit HEMT cell device and for a two-finger Unit HEMT cell device, respectively. This Unit HEMT cell structure could be extended to a multi-finger Unit HEMT cell device having a number of fingers greater than two fingers. Reusing layers required to form a Unit HEMT cell switch device makes this layout compact, smaller in size, and more cost effective.

In another embodiment of the Unit HEMT cell (not shown), there is no virtual node N connected to the resistors 606, 608. In such other embodiment, virtual node 502 (see FIG. 5B) is absent.

See also the discussion above with reference to FIG. 3B regarding a cross-sectional view of a dual-gate Unit HEMT cell. Compare to the semiconductor device structures shown in the top views of the Unit HEMT cell in FIGS. 6A and 6B, also showing the virtual node N between the two gates G1 and G2. Also compare to the circuit shown schematically in FIG. 6C, including the biasing resistors 602, 604, 606, 608, and the virtual node N.

A node 612 at one of the gate inputs (e.g., at the gate G1 contact of the gate bias resistor 602) can be monitored with an RF sense circuit (not shown in FIG. 6C) to provide an RF detect signal indicating the detection of a high power RF signal present in at least one of the drain or source of the first GaN HEMT device. This signal would also indicate the detection of a high power RF signal present in at least one of the drain or source of the Unit HEMT cell including the first GaN HEMT device. An example of a use of this RF detect signal will be discussed in more detail with reference to FIG. 9.

Figure 7:
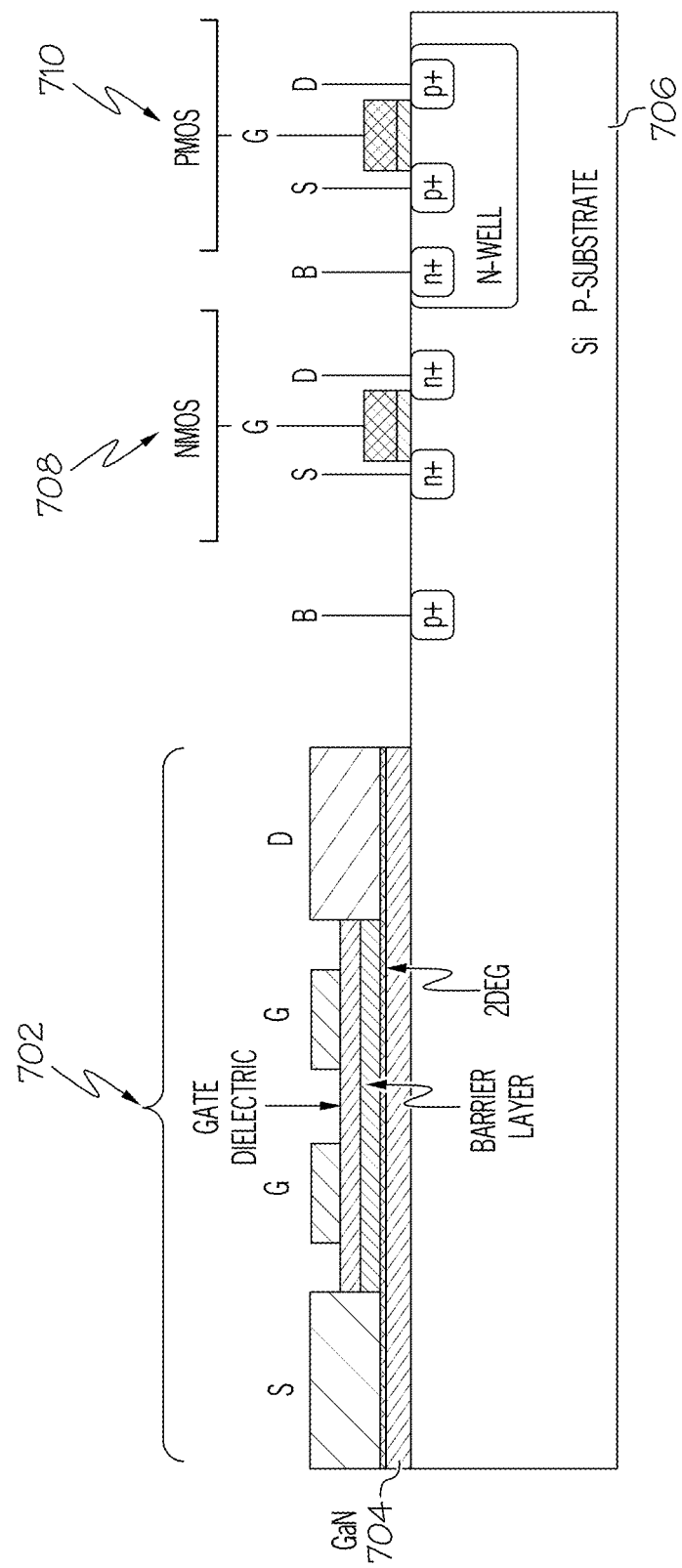
FIG. 7 is a cross-sectional view of an example of a GaN HEMT device, and an NMOS device and a PMOS device of a controller, all of which are integrated on a same die.

FIG. 7 is a cross-sectional view illustrating an example of a GaN HEMT device 702 fabricated with a GaN layer 704 on top of a silicon substrate layer 706. The silicon substrate layer 706 also can support fabrication of NMOS devices 708 and PMOS 710 can be used to create a control circuit sharing the silicon substrate with the GaN HEMT 702. The GaN HEMT device 702, and the NMOS device 708 and the PMOS device 710 of a controller, can all be integrated on a same die. It should be noted that various embodiments of the present disclosure may implement a CMOS controller fabricated on a separate die from the GaN HEMT device 702. It is not necessary that both the controller and the GaN HEMT device 702 be on the same substrate. In certain embodiments, the entire controller and the GaN HEMT device 702 are integrated on a same substrate. Optionally, a plurality of Unit HEMT cells shares the same substrate as the entire controller. For example, with reference to FIG. 9, the Unit HEMT cell 904 and the entire controller 902 can be on the same substrate.

GaN-on-silicon technology allows the GaN HEMT switch devices 702 and the CMOS controller devices 708, 710, to be integrated on a same die, thereby making a total solution very small. The GaN HEMT devices 702 are grown on a silicon circuit supporting substrate 706 with a GaN layer 704. Because the GaN HEMT devices 702 are grown on a silicon substrate 706, the same silicon substrate can be used to grow CMOS devices 708, 710 by etching off the GaN layer 704 and growing NMOS and PMOS devices 708, 710 using standard CMOS process. This allows an RF GaN device 702 to be integrated together with a CMOS controller device 708, 710, thereby advantageously eliminating a two-die total solution.

Figure 8:
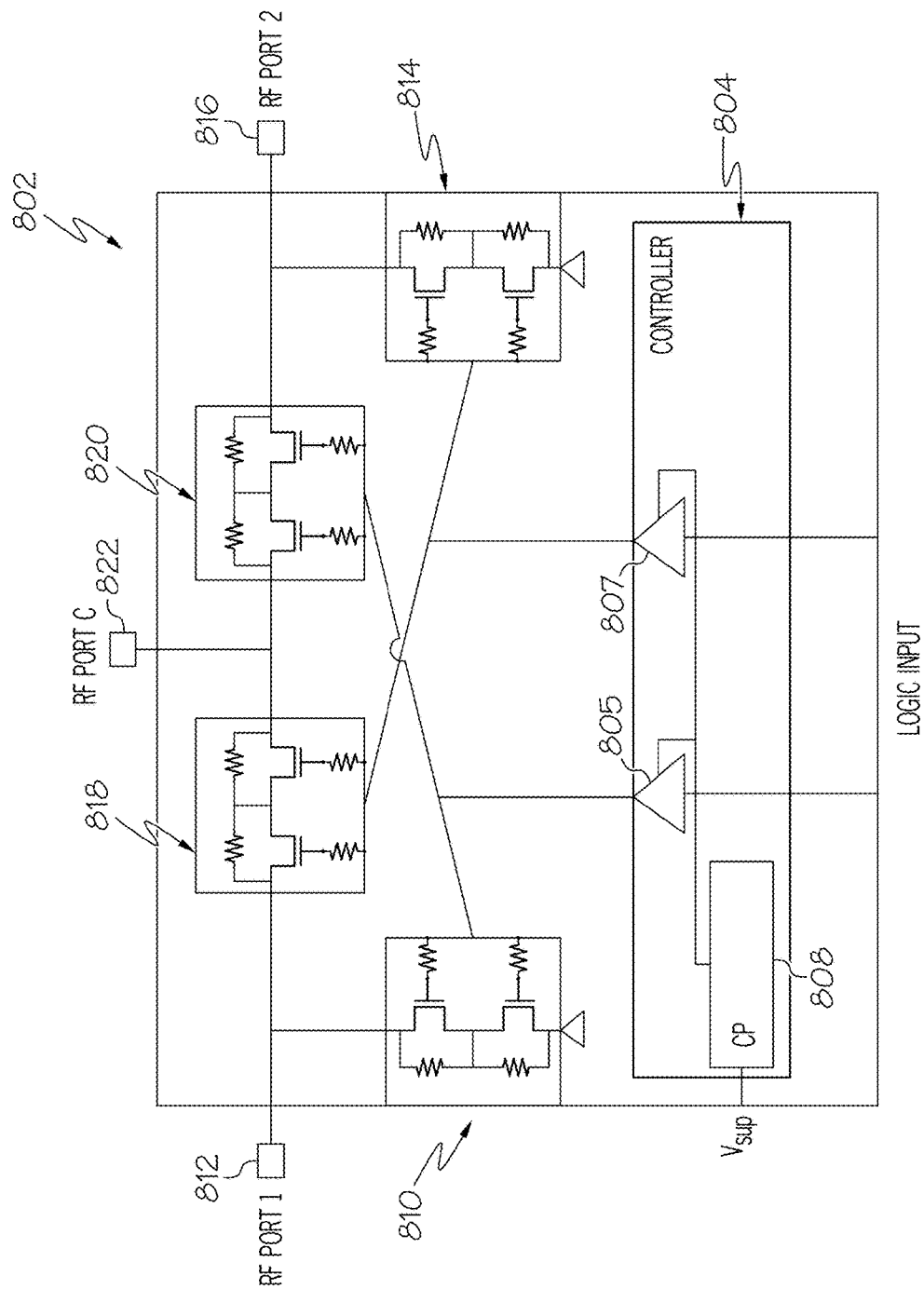
FIG. 8 is a schematic of an example of a single-pole, double-throw (SP2T) RF solid state switch device that uses GaN HEMT solid state switches and a controller to selectively connect an RF port to one of two other RF ports, in accordance with the disclosure.

FIG. 8 is a schematic of an example of a single-pole, double-throw (SP2T) RF switch that uses a plurality of HEMT cell switches in accordance with the disclosure. According to various embodiments, FIG. 8 illustrates an example of an RF signal multiplexer device 802. The RF signal multiplexer device 802 includes a controller 804, a plurality of output drive circuits 805, 807, and a plurality of HEMT cell devices 810, 814, 818 and 820, to selectively couple RF signal between a common RF port 822 and one of a first RF port 812 and a second RF port 816.

According to the example, the controller 804 includes output drive circuits 805, 807, that can be selectively driven by the controller 804 to control, in this example, pairs of the HEMT cell switches 810, 814, 818 and 820, as shown. The controller 804 also includes a charge pump 808 and a negative voltage level shifter (see also FIG. 9 and the associated discussion below) that can be controlled to provide the negative voltage for the output drive circuits 805, 807. The inputs to the gate resistors of each of the HEMT cells 810, 814, 818 and 820 are tied together and commonly driven by one of the output drive circuits 805, 807.

To turn OFF a HEMT cell switch 810, 814, 818 and 820, the gate inputs are driven by one of the output drive circuits 805, 807 with negative voltage. If the gate inputs are not driven with a negative voltage, they are driven with a zero voltage from the one of the output drive circuits 805, 807. An HEMT cell switch 810, 814, 818, 820, will be turned ON when the respective gate inputs are driven with zero voltage. This allows RF signal transmission between the drain and source of the HEMT cell switch 810, 814, 818, 820.

To connect RF port 1 812 with common RF port C 822, output drive circuit 805 drives a negative voltage signal into the gate inputs of a pair of HEMT cells 810, 820 to turn them OFF. Contemporaneously, the output drive circuit 807 drives zero voltage into the gate inputs of HEMT cells 818, 814, thereby allowing the HEMT cells 818, 814, to be turned ON. In this way, an RF signal is coupled between the RF port 1 812 and the common RF port C 822. The design of the HEMT cell 818, according to various embodiments, is optimized to reduce signal insertion loss from the signal transmission path between the drain and source of the HEMT cell 818.

The gate inputs of the HEMT cell 820 are driven with negative voltage signal (i.e., the HEMT cell switch 820 is turned OFF) which isolates (blocks) an RF signal when present at common RF port C 822 from coupling to RF port 2 816. The design of the blocking HEMT cell switch 820, according to various embodiments, is optimized to enhance isolation (blocking) of RF signal transmission between the drain and source of HEMT cell 820 when the HEMT cell switch 820 is turned OFF.

The gate inputs of HEMT cell 814 are also driven with a zero voltage from the output drive circuit 807, and accordingly the HEMT cell switch 814 is turned ON thereby creating a short (transmission path) to RF ground, further reducing any RF signal that is coupled through the Unit HEMT cell while it is turned OFF. This further improves the isolation performance of the RF multiplexer switch 802.

Alternatively, to connect RF signal between common RF port C 822 and RF port 2 816, the controller 804 controls the output drive circuit 807 to output a negative bias voltage signal into the gate inputs of the HEMT cells 818, 814. Contemporaneously, the controller 804 controls the output drive circuit 805 to output a zero bias voltage signal into the gate inputs of the HEMT cells 810, 820. In this way, an RF signal present at RF port C 822 is electrically coupled to RF port 2 816 via the HEMT cell switch 820. According to various embodiments, the design of the HEMT cell 820 is optimized for low insertion loss transmission of RF signal between the two RF ports 822, 816, and the common RF port 822.

The gate inputs of the HEMT cells 814, 818 are driven with a negative bias voltage signal to turn OFF the HEMT cell switches 814, 818. The Unit HEMT cell 818 when turned OFF isolates (blocks) RF signal when present at RF port C 822 from being coupled between the drain and source of Unit HEMT cell 818 and thereby reaching RF port 1 812. Additionally, the Unit HEMT cell 810 is turned ON and thereby electrically couples RF port 1 812 to RF ground reference. This coupling to RF ground further reduces any RF signal that is coupled through the Unit HEMT cell 818 while it is turned OFF. This further improves the isolation performance of the RF multiplexer switch 802. In the present example, the RF signal multiplexer 802 provides low insertion loss in the Unit HEMT cell switch 820 between RF port C 822 and RF port 2 816 and at the same time provides high isolation (blocking) of RF signal transmission in the Unit HEMT cell switch 818 between RF port C 822 and RF port 1 812.

In other embodiments (not shown) of the RF signal multiplexer device 802, the HEMT cell switches 810, 814, 818 and 820 are interconnected differently in increase isolation and to decrease insertion loss.

Figure 9:
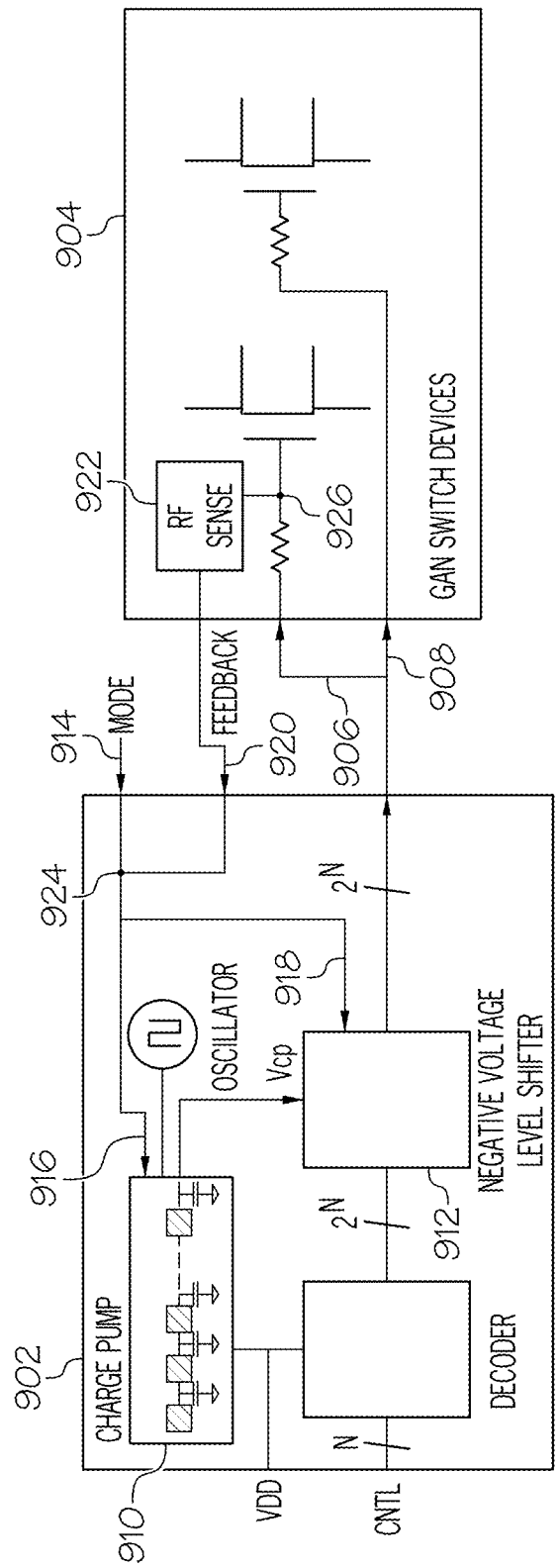
FIG. 9 is a circuit block diagram illustrating an example of a controller and driver circuit selectively controlling GaN switch devices, according to an embodiment of the present disclosure.

Referring to FIG. 9, a controller and driver circuit 902 can control selection of one of a high-level negative bias voltage signal or a low-level negative bias voltage signal being driven into the gate inputs of the GaN HEMT switch devices 904 of a Unit HEMT cell. A high-level negative bias voltage signal at the gate input of the GaN HEMT switch devices 904 further increases isolation between the drain and source of the GaN HEMT switch devices 904. (See also FIG. 6C and the associated discussion above.) However, this high-level negative bias voltage signal also consumes a greater amount of current drain in driving the gate inputs of the GaN HEMT switch devices 904 of the Unit HEMT cell.

On the other hand, a low-level negative bias voltage signal driven at the gates of the GaN HEMT switch devices 904 reduces isolation between the drain and source of the GaN HEMT switch devices 904 while turning OFF the GaN HEMT switch devices 904. Contemporaneously, the low-level negative bias voltage signal reduces the amount of current drain driving the gates of the GaN HEMT switch devices 904. By selecting to drive into the gate inputs of the GaN HEMT switch devices 904 one of high-level negative bias voltage signal or low-level negative bias voltage signal, a particular implementation can trade-off between higher isolation in the switch 904 with higher current drain in driving the gates of the GaN HEMT switch devices 904, and lower isolation with lower current drain in driving the GaN HEMT switch devices 904. The higher isolation may be desired to turn OFF the GaN HEMT switch devices 904 with a high power RF signal present on one of the drain or source of the Unit HEMT cell comprising the GaN HEMT switch devices 904.

For example, when there is a high power RF signal present in one of the drain or source of the Unit HEMT cell comprising the GaN HEMT switch devices 904 it may be desirable to increase isolation of this high power RF signal from passing between the drain and source of the Unit HEMT cell comprising the GaN HEMT switch devices 904. The gates of the GaN HEMT switch devices 904 can be driven with a high-level negative bias voltage signal to increase isolation. This higher isolation is obtained by trading off higher current drain driving the gates of the GaN HEMT switch devices 904.

When there is a low power (weak) RF signal, or no RF signal, detected in one of the drain or source of the Unit HEMT cell comprising the GaN HEMT switch devices 904, it may be desirable to reduce current drain in driving the gates of the GaN switch devices 904 while maintaining lower, but still acceptable, isolation between the drain and source of the Unit HEMT cell. In this case, the controller and driver circuit 902 can drive the gates of the GaN HEMT switch devices 904 with a low-level negative bias voltage signal resulting in lower current drain while tolerating a lower isolation of an RF signal between the drain and source of the Unit HEMT cell comprising the GaN HEMT switch devices 904.

As illustrated in the example of FIG. 9, the controller and driver circuit 902 can drive the gate inputs to the GaN HEMT switch devices 904, which according to various embodiments can comprise one or more Unit HEMT cells. In one example implementation, a controllable charge pump 910 provides voltage to a controllable negative voltage level shifter 912 which then can drive outputs 906, 908 with a gate control signal. These outputs 906, 908 drive the gate control signal into the gate input of one or more Unit HEMT cells and thereby into the gates of the GaN HEMT switch devices 904 of the one or more Unit HEMT cells. In this example, each gate of a GaN HEMT switch device 904 is electrically coupled to one contact of a gate bias resistor with the other contact of the gate bias resistor coupled to the gate input of the Unit HEMT cell comprising the GaN HEMT switch device 904. The outputs 906, 908, from the negative voltage level shifter 912 provide the drive of the gate control signal into the gate of the one or more GaN switch devices 904 of a Unit HEMT cell.

According to a first example embodiment, the controller drives a mode selection logic signal 914 (e.g., driven to a "1" or a "0" value) into the input 916 of the charge pump 910 and into the input 918 of the negative voltage level shifter 912. In this way, the controller controls each of the charge pump 910 and the negative voltage level shifter 912 to select to drive at the output lines 906, 908 one of a high-level negative bias voltage signal or a low-level negative bias voltage signal.

Recall from the discussion above that a high-level negative bias voltage signal driven into the gate inputs of the GaN HEMT switch devices 904 can increase isolation between the drain and source of the GaN HEMT switch devices 904. However, this also consumes a greater amount of current drain in driving the gates of the GaN HEMT switch devices 904. On the other hand, a low-level negative bias voltage signal driven into the gate inputs of the GaN HEMT switch devices 904 reduces isolation between the drain and source of the GaN HEMT switch devices 904, while contemporaneously reducing the amount of current drain in driving the gates of the GaN HEMT switch devices 904.

According to a second example embodiment, the controller couples a feedback signal 920 received from, for example, an RF sense circuit 922 in one of the GaN HEMT switch devices 904, into the input 916 to the charge pump 910 and the input 918 to the negative voltage level shifter 912. In this way, the controller can control the selection of one of a high-level negative bias voltage signal or a low-level negative bias voltage signal be driven at the outputs 906, 908 from the negative voltage level shifter 912.

This feedback signal 920 is generated, according to one example, using an RF sense circuit 922 coupled to the gate contact 926 of the gate bias resistor of one of the GaN HEMT switch devices 904 in the Unit HEMT cell. See also the gate bias resistor 602 and the node 612 shown in FIG. 6C, and the associated discussion above.

The gate input of the Unit HEMT cell, in this example, is electrically coupled to one contact of the gate bias resistor. The other contact of the gate bias resistor is connected to the gate of one of the GaN HEMT switch devices 904. The gate input of the Unit HEMT cell is connected to the drive output line 906, which drives the negative bias voltage signal, via the gate bias resistor, into the gate of the one of the GaN HEMT switch devices 904. Similarly, as shown in the example of FIG. 9, the gate input of the Unit HEMT cell is connected to the drive output line 908, which drives the negative bias voltage signal via a gate bias resistor into the gate of another one of the GaN HEMT switch devices 904.

An RF signal can be detected present at the gate of one of the GaN HEMT switch devices 904 and at the gate contact 926 of the gate bias resistor, such as due to a high power RF signal being present in at least one of the drain or source of the GaN HEMT switch device 904. See also RF signal $V_{RF}$ in FIGS. 3A, 3B, and 3C. The RF sense circuit 922 senses the presence of a high power RF signal at the gate contact 926 of the gate bias resistor and generates an output RF detect signal 920, e.g., a logic output drive signal 920 (e.g., driven to a "1" or a "0" value), indicating the detection of a high power RF signal present in at least one of the drain or source of the GaN HEMT switch device 904.

This RF detect signal is a feedback signal 920 which the controller couples into the input 916 of the charge pump 910 and the input 918 of the negative voltage level shifter 912. This feedback signal 920 controls the selection of one of high-level negative bias voltage signal or low-level negative bias voltage signal be driven at the drive outputs 906, 908, of the negative voltage level shifter 912.

According to a third example embodiment, node 924 comprises an AND logic circuit to apply an AND logic function to the two input signals, i.e., the mode input signal 914 and the feedback signal 920. The AND logic circuit output at node 924 can drive the input 916 of the charge pump 910 and the input 918 of the negative voltage level shifter 912. The AND logic circuit would determine its output based on the logic AND function combination of the mode signal 914 and the feedback signal 920. In this example, to drive the output of the AND logic circuit to a first logic level (e.g. a logic "1"), each of the mode signal 914 and the feedback signal 920 are driven to, say, a logic "1" input into the AND logic circuit 924. If either the mode signal 914 or the feedback signal 920 are driven to a logic "0" input into the AND logic circuit 924 then the output of the AND logic circuit 924 would be driven to a second logic level (e.g. a logic "0").

In this way, for example, a high-level negative bias voltage signal output would be driven at 906, 908 only when both the mode signal 914 and the feedback signal 920 are a logic "1". That is, for example, the controller would control at least one controllable charge pump to selectively generate a high-level negative bias voltage signal at outputs 906, 908, thereby increasing RF signal isolation between the drain and source of the respective Unit HEMT cell, only while an RF detect signal at the feedback input 920 of the controller indicates a detection of a high power RF signal present in at least one of the drain or source of the GaN HEMT device 904 of the respective Unit HEMT cell.

Other implementations to control whether a high-level negative voltage signal output or a low-level negative voltage signal output would be driven at 906, 908, are possible in view of the present disclosure. For example, instead of an AND logic circuit and function an alternative OR logic circuit and function may be used to control the controllable charge pump 910 and the negative voltage level shifter 912.

Figure 10:
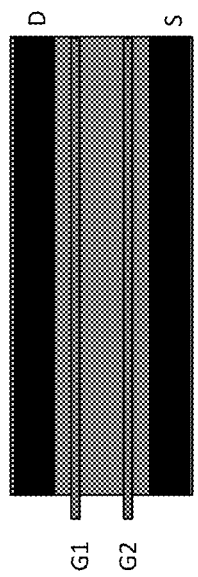
FIG. 10 is a top view of the GaN HEMT structure shown in FIG. 5B without a virtual node.

FIG. 10 is a top view of the GaN HEMT structure shown in FIG. 5B without a virtual node.

Figure 11:
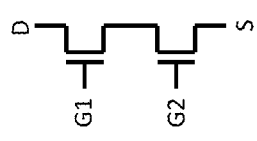
FIG. 11 is a schematic of the GaN HEMT structure shown in FIG. 10.

FIG. 11 is a schematic of the GaN HEMT structure shown in FIG. 10.

Figure 12:
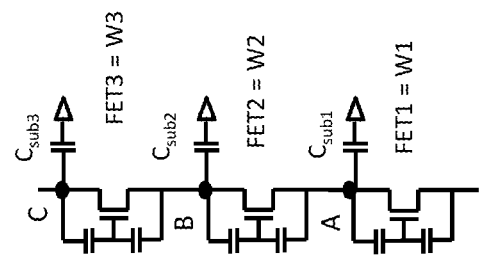
FIG. 12 is a schematic of a switch in accordance with the invention with stacked GaN HEMTs having different widths.

FIG. 12 is a schematic of a switch in accordance with the invention with stacked GaN HEMTs having different widths. An RF switch in accordance with the invention is realized without stacking many devices in series for voltage handing capability. A switch designed without stacking multiple devices reduces capacitance to substrate. Compare, for example, a switch with one device versus a switch with N devices in series. A total substrate capacitance for N stacked devices has $N^2$ higher total capacitance to substrate compared to switch with a single device. Higher device area adds significantly higher substrate loss. In the circuit in accordance with the invention, substrate loss is minimized by realizing a switch with no stack or with a minimum number of devices in the stack to handle large voltage.

In some modern communication, a peak-to-average ratio of a signal is very high. In such application, a switch needs to handle very large peak power for a short time. For example, a LTE macro base station requires a switch to handle a peak power of 632 W. In such application, GaN technology requires only a few devices in a stack of devices, which is a significantly lower number of devices than a number of devices required in a stack using other technology where device breakdown itself is much lower than with GaN technology. In order for voltage to divide equally, each device in a stack is sized with a different width (W). This is due to fixed substrate capacitance to ground. For example, in FIG. 12, the widths are sized such that total capacitance at node B is half of total capacitance at node A. Similarly, total capacitance at node C is ⅓ of total capacitance at node A. This requires W3>W2>W1. FIG. 12 is a schematic of a switch in accordance with the invention designed with stacked GaN HEMTs having different widths such that a RF voltage is divided equally so that the switch in accordance with the invention can handle large RF power.

A high-power switch is required to have better thermal performance and good electrical isolation from a controller that generates a bias voltage for the high-power switch. The high-power switch in accordance with the invention is packaged in an air-cavity package to improve electrical isolation from the controller 804 and 902. Having good electrical isolation reduces a drop in bias voltage due to coupling of RF energy into a die of the controller 804 and 902. Better thermal performance is achieved by using a high thermal conductive die attach epoxy to reduce a total thermal resistance of the high-power switch.

FIG. 13 is a cross-sectional view of a GaN HEMT structure with dual gates, in accordance with one embodiment of the disclosure.

FIG. 14 is a cross-sectional view of a GaN HEMT structure with dual gates with a through silicon via, in accordance with another embodiment of the disclosure.

FIG. 15 is a simplified schematic of a switch in accordance with one embodiment of the disclosure. In the switch in accordance with the invention, a connection to a package pin is accomplished using a through silicon via (TSV) to improve high frequency performance of the switch. As an example, grounding of a shunt GaN HEMT in a SP4T switch is critical to achieve good isolation performance at high frequency. See Unit HEMT cell 810 and Unit HEMT cell 814 in the SP2T RF switch of FIG. 8 as additional examples of shunt GaN HEMTs that can be grounded to a package pin using a TSV. In FIG. 14, a ground connection of one of the shunt GaN HEMTs is shown. In one embodiment, the ground connection is done through bondwire to a package pin. In another embodiment, the ground connection to the package pin is done with a TSV. Grounding using a TSV significantly reduces inductance in ground path and improves isolation performance compared to grounding through bondwire.

FIG. 16 is a schematic of a GaN HEMT with two gates, as can be used in the switch of FIG. 15.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

Some features of the present disclosure might be used in one embodiment thereof without use of other features of the present disclosure. As such, the foregoing description should be considered as merely illustrative of the principles, teachings, examples, and exemplary embodiments of the present disclosure, and not a limitation thereof.

In addition, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A Unit high-electron-mobility transistor (hereinafter "HEMT") cell, comprising:
   a gallium nitride (hereinafter "GaN") layer;
   a two-dimensional electron gas (hereinafter "2DEG") layer disposed on the GaN layer;
   a gate dielectric layer disposed on the 2DEG layer;
   a GaN HEMT having a gate disposed on the gate dielectric layer, a drain adjacent to one side of the gate and a source adjacent to an opposing side of the gate, the GaN HEMT disposed on and including the GaN layer, and the GaN HEMT having its gate coupled to one terminal of a 2DEG gate bias resistor;
   a HEMT cell gate coupled to another terminal of the 2DEG gate bias resistor;
   a HEMT cell drain coupled to one terminal of a 2DEG linearity resistor and to the drain of the GaN HEMT; and
   a HEMT cell source coupled to another terminal of the 2DEG linearity resistor and to the source of the GaN HEMT.

2. The Unit HEMT cell of claim 1, wherein the GaN layer is disposed on a circuit supporting substrate layer comprising one of a silicon substrate layer and a silicon carbide substrate layer.

3. The Unit HEMT cell of claim 1, further comprising an insulative barrier layer interposed between the gate dielectric layer and the 2DEG layer.

4. The Unit HEMT cell of claim 1, wherein the 2DEG linearity resistor is disposed in the 2DEG layer.

5. A Unit high-electron-mobility transistor (hereinafter "HEMT") cell, comprising:
   a gallium nitride (hereinafter "GaN") layer;
   a two-dimensional electron gas (hereinafter "2DEG") layer disposed on the GaN layer;
   a gate dielectric layer disposed on the 2DEG layer;
   a plurality of GaN HEMTs disposed on the GaN layer, each GaN HEMT of the plurality of GaN HEMTs being electrically connected in series with each other such that a first GaN HEMT is electrically connected in series with a second GaN HEMT by sharing one of a drain and a source of the first GaN HEMT with one of the other of a drain and a source of the second GaN HEMT;
   a HEMT cell drain, a HEMT cell source, and a HEMT cell gate;
   the HEMT cell gate coupled to one terminal of a first 2DEG gate bias resistor and another terminal of the first 2DEG gate bias resistor coupled to a gate of the first GaN HEMT;
   the HEMT cell gate also coupled to one terminal of a second 2DEG gate bias resistor, wherein another terminal of the second 2DEG gate bias resistor is coupled to a gate of the second GaN HEMT;
   the drain of the first GaN HEMT coupled to one terminal of a first 2DEG linearity resistor and the source of the first GaN HEMT coupled to another terminal of the first 2DEG linearity resistor;
   the drain of the second GaN HEMT also coupled to one terminal of a second 2DEG linearity resistor and the source of the second GaN HEMT coupled to another terminal of the second 2DEG linearity resistor;
   the HEMT cell drain coupled to a remaining unshared drain or source of a very first GaN HEMT in the plurality of GaN HEMTs; and
   the HEMT cell source coupled to a remaining unshared drain or source of a very last GaN HEMT in the plurality of GaN HEMTs.

6. The Unit HEMT cell of claim 5, wherein the first 2DEG gate bias resistor, the second 2DEG gate bias resistor, the first 2DEG linearity resistor and the second 2DEG linearity resistor are disposed in the 2DEG layer.

7. The Unit HEMT cell of claim 5, wherein each GaN HEMT includes a gate disposed on the gate dielectric layer, and a drain adjacent to one side of the gate and a source adjacent to an opposing side of the gate.

8. The Unit HEMT cell of claim 5, wherein the GaN layer is disposed on a circuit supporting substrate layer comprising one of a silicon substrate layer and a silicon carbide substrate layer.

9. The Unit HEMT cell of claim 5, further comprising an insulative barrier layer interposed between the gate dielectric layer and the 2DEG layer.

10. The Unit HEMT cell of claim 6, wherein the Unit HEMT cell includes at least three GaN HEMTs disposed on the GaN layer and electrically connected in series with each other;
    a third GaN HEMT electrically connected in series with the second GaN HEMT by sharing one of a drain and a source of the third GaN HEMT with one of the other of the drain and the source of the second GaN HEMT that is unshared with the first GaN HEMT;
    the HEMT cell gate coupled to one terminal of a third 2DEG gate bias resistor, and another terminal of the third 2DEG gate bias resistor coupled to a gate of the third GaN HEMT; and
    the drain of the third GaN HEMT coupled to one terminal of a third 2DEG linearity resistor, and the source of the third GaN HEMT coupled to another terminal of the third 2DEG linearity resistor,
    wherein the third 2DEG gate bias resistor and the third 2DEG linearity resistor are disposed in the 2DEG layer.

11. A circuit comprising:
    a Unit high-electron-mobility transistor (hereinafter "HEMT") cell coupled to a controller, the Unit HEMT cell including:
    a gallium nitride (hereinafter "GaN") layer, a two-dimensional electron gas (hereinafter "2DEG") layer disposed on the GaN layer, a gate dielectric layer disposed on the 2DEG layer, a plurality of GaN HEMTs including a first GaN HEMT and a second GaN HEMT disposed on the gate dielectric layer, wherein the first GaN HEMT and the second GaN HEMT are configured such that one of a drain and a source of the first GaN HEMT and one of the other of a drain and a source of the second GaN HEMT are connected to a shared node, a HEMT cell drain coupled to a remaining unshared drain or source of the first GaN HEMT, a HEMT cell source coupled to a remaining unshared drain or source of the second GaN HEMT, the drain of the first GaN HEMT coupled to one terminal of a first 2DEG linearity resistor, and the source of the first GaN HEMT coupled to the other terminal of the first 2DEG linearity resistor, the drain of the second GaN HEMT coupled to one terminal of a second 2DEG linearity resistor, and the source of the second GaN HEMT coupled to the other terminal of the second 2DEG linearity resistor, a HEMT cell gate coupled to one terminal of a first 2DEG gate bias resistor, wherein another terminal of the first 2DEG gate bias resistor is coupled to a gate of the first GaN HEMT, the HEMT cell gate also coupled to one terminal of a second 2DEG gate bias resistor, wherein another terminal of the second 2DEG gate bias resistor is coupled to a gate of the second GaN HEMT, and a radio frequency sense circuit having an input terminal coupled to the gate of one GaN HEMT of the plurality of GaN HEMTs and having an output terminal coupled to the controller, wherein the radio frequency sense circuit outputs a feedback signal in response to detecting a high power radio frequency signal present in at least one of the drain and the source of the one GaN HEMT; and the controller including:
  a charge pump having an input terminal coupled to the output terminal of the radio frequency sense circuit and having an output terminal, and
  a negative voltage level shifter having a first input terminal coupled to the output terminal of the charge pump, a second input terminal coupled to the output terminal of the radio frequency sense circuit and having an output terminal coupled to the HEMT cell gate, wherein, in response to the feedback signal, the controller outputs one of a high-level negative bias voltage signal and a low-level negative bias voltage signal to the HEMT cell gate.

12. The circuit of claim 11, wherein, in response to the radio frequency sense circuit detecting the high power radio frequency signal present in at least one of the drain and the source of the one GaN HEMT, the controller outputs the high-level negative bias voltage signal thereby increasing isolation between the drain and source of each GaN HEMT of the plurality of GaN HEMTs of the Unit HEMT cell.

13. The circuit of claim 11, wherein the GaN layer is disposed on a substrate, and the controller is disposed on the substrate.

14. The circuit of claim 11, wherein the controller includes a logic gate having one input terminal receiving the feedback signal and having another input terminal receiving a mode signal from a radio, and having an output terminal coupled to the input terminal of the charge pump and to the second input terminal of the negative voltage level shifter, wherein the controller outputs the one of a high-level negative bias voltage signal and a low-level negative bias voltage signal to the HEMT cell gate based on a combination of the feedback signal and the mode signal.

* * * * *